United States Patent
Gibas et al.

(10) Patent No.: US 12,523,745 B2
(45) Date of Patent: Jan. 13, 2026

(54) INJECTION CURRENT MODULATION FOR CHIRP SIGNAL TIMING CONTROL

(71) Applicant: NXP B.V., Eindhoven (NL)

(72) Inventors: Piotr Gibas, Eindhoven (NL); Tarik Saric, Eindhoven (NL)

(73) Assignee: NXP B.V., Eindhoven (NL)

( * ) Notice: Subject to any disclaimer, the term of this patent is extended or adjusted under 35 U.S.C. 154(b) by 331 days.

(21) Appl. No.: 17/846,755

(22) Filed: Jun. 22, 2022

(65) Prior Publication Data

US 2023/0417872 A1 Dec. 28, 2023

(51) Int. Cl.
*G01S 7/40* (2006.01)
*H03L 7/099* (2006.01)
*G01S 13/32* (2006.01)
*H03L 7/093* (2006.01)

(52) U.S. Cl.
CPC .......... *G01S 7/4056* (2013.01); *G01S 7/4004* (2013.01); *H03L 7/099* (2013.01)

(58) Field of Classification Search
CPC .... G01S 7/4056; G01S 7/4004; G01S 7/4073; G01S 13/343; G01S 13/32; G01S 13/34; G01S 13/931; G01S 7/02; G01S 7/35; G01S 7/4008; G01S 13/282; G01S 7/032; H03L 7/099; H03L 7/093; H03L 7/1072; H03L 7/1075; H03L 7/197; H03L 7/0802; H03L 7/081; H03L 7/193; H03L 7/087; H03L 7/104; H03L 7/102; H03L 7/18; H03L 7/1976; H03L 7/0991; H03L 7/22; H03L 7/0891; H03B 23/00; H03B 5/1231; H03B 1/04; H03C 3/0916; H03C 3/0925; H03C 3/0941; H03C 3/095; H03C 3/0991; H03C 3/0933; H03C 3/0958; H04B 1/69; H04B 2001/6912; H04B 1/7073; H04B 2201/7073; G05F 1/46; G01R 19/0092; G01R 35/005
USPC .................. 342/165, 128, 538, 132; 375/139
See application file for complete search history.

(56) References Cited

U.S. PATENT DOCUMENTS

| | | | |
|---|---|---|---|
| 7,436,228 B1 * | 10/2008 | Hoang | H03L 7/093 327/158 |
| 7,619,451 B1 * | 11/2009 | Hoang | H03L 7/0816 327/146 |
| 10,001,548 B2 * | 6/2018 | Phillips | G01S 7/4008 |
| 10,340,926 B2 | 7/2019 | Chillara et al. | |
| 11,228,318 B1 | 1/2022 | Saric et al. | |
| 2003/0076175 A1 * | 4/2003 | Fischer | H03L 7/093 331/17 |
| 2017/0371362 A1 * | 12/2017 | Fernald | G01R 19/0092 |
| 2018/0097522 A1 * | 4/2018 | Chillara | H03L 7/0991 |
| 2018/0267159 A1 | 9/2018 | Wada et al. | |
| 2019/0013815 A1 * | 1/2019 | Saric | H03L 7/197 |
| 2019/0377076 A1 | 12/2019 | Vigier et al. | |

(Continued)

*Primary Examiner* — Vladimir Magloire
*Assistant Examiner* — Remash R Guyah

(57) ABSTRACT

A radar system injects a calibrated current at a signal generator during a reset portion and acquisition portion of each chirp period. The signal generator employs "gear-switching" to reduce PLL bandwidth during an acquisition phase and to increase the phase lock loop (PLL) bandwidth during a reset phase. By employing gear switching to change the bandwidth of the PLL circuit during the different portions of each chirp period, the length of the reset period is reduced, thus improving overall efficiency of the radar system while maintaining good performance.

20 Claims, 10 Drawing Sheets

(56) References Cited

U.S. PATENT DOCUMENTS

2019/0377078 A1\* 12/2019 Vigier .................. G01S 7/4008
2022/0206133 A1\* 6/2022 Subburaj .............. H03C 3/0941

\* cited by examiner

INJECTION CURRENT MODULATION FOR CHIRP SIGNAL TIMING CONTROL

BACKGROUND

Frequency-modulated continuous-wave (FMCW) radar systems provide certain advantages over other continuous wave radar systems, including supporting good distance measurement. Such systems are therefore useful in automotive applications, such as cruise control and anti-collision control applications. In particular, a frequency chirp period is defined by a dwell and settle portion, during which a FMCW signal generator prepares to sweep the signal from the initial frequency, an acquisition portion, during which the signal is swept over the frequency bandwidth, and a reset portion, during which the signal is returned to the initial frequency. It is typically desirable to reduce the length of the reset period in order to improve the overall efficiency and dynamic range of the radar system. However, existing approaches to reducing reset period length typically require high PLL bandwidth in order to prevent cycle slips at the PLL, and this high PLL bandwidth can increase phase noise, thus degrading performance of the PLL circuit and the corresponding radar system.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-11 illustrate techniques for improving the performance of an FMCW radar system by injecting a calibrated current at the FMCW generator during the reset portion and acquisition portion of each chirp period. In particular, the FMCW generator employs "gear-switching" to reduce PLL bandwidth during an acquisition phase and to increase the PLL bandwidth during a reset phase. By employing gear switching to change the bandwidth of the PLL circuit during the different portions of each chirp period, the length of the reset period is reduced, thus improving overall efficiency of the radar system while maintaining good performance.

In at least one embodiment, the PLL circuit employs a current injector (e.g., a current injection digital-to-analog converter (DAC)) to inject current at the LPF capacitors of the PLL circuit. During a calibration period of the radar system, the amount of current provided by the current injector is calibrated to achieve a specified frequency bandwidth for the PLL circuit during normal operation. For example, in at least one embodiment, during the calibration period, the PLL circuit is placed in a closed loop configuration and is operated at the specified frequency bandwidth. The LPF capacitors are fed by a set of buffers of the current injector. However, the injection current is not used to feed the PLL circuit; instead, the injection current is compared to the buffer current being provided to the LPF capacitors, and the level of the injection current is adjusted until it closely matches the current provided by the LPF capacitors during a closed loop operation. A chirp injection current profile is thus set for an effective charge pump current along the chirp slope, resulting in an accurate level of injection current that accounts for variables such as temperature and process variations, non-linearity of the PLL voltage control oscillator, and the like.

Figure 1:
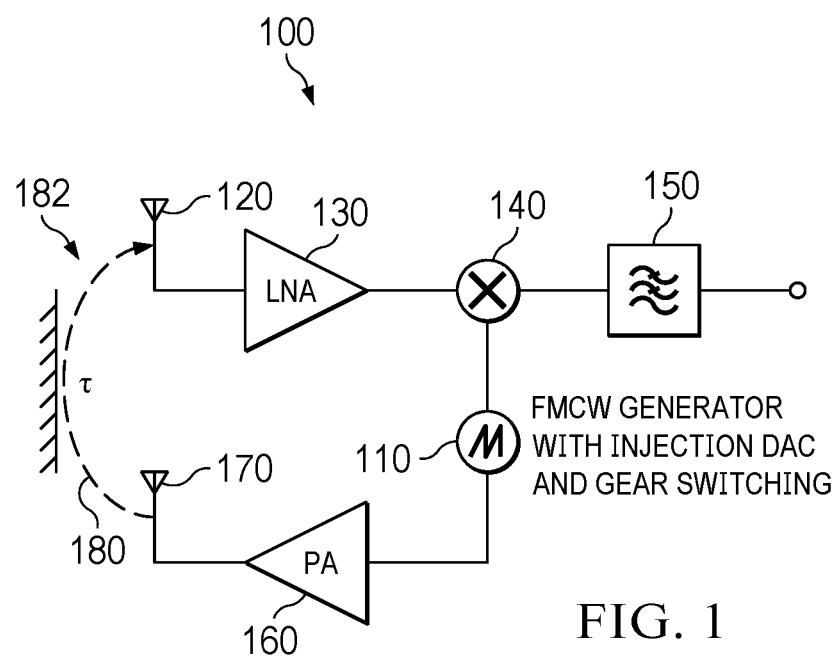
FIG. 1 is a block diagram of a radar device employing an FMCW signal generator that employs a calibrated injection current profile and gear switching to reduce the length of a reset period in accordance with some embodiments.

FIG. 1 is a block diagram of a radar system 100 employing a FMCW generator 110 according to some embodiments. The radar system 100 is generally configured to generate an output signal 180 (also referred to as a radar signal) that is reflected from an object as reflected signal 182. Based on the reflected signal 182, the radar system 100 determines the distance of the object from the system, or from a device including the radar system 100. Accordingly, the radar system 100 can be employed in a wide variety of devices to, for example, identify when a device is within a threshold distance of an object. For example, the radar system 100 can be employed in a proximity sensor incorporated in an automobile to provide feedback to a driver, and in particular to indicate when the automobile is close to an object.

To support generation of the radar signal 180 and determination of the distance to the object, the radar system 100 includes the FMCW generator 110, antennas 120 and 170, a low noise amplifier 130, a mixer 140, a low-pass filter 150, and a power amplifier 160. The FMCW generator 110 employs a PLL, described further below, is configured to generate a signal that is supplied to the power amplifier (PA) 160, which amplifies the received signal to generate the radar signal 180. As described below, the FMCW generator 110 uses the PLL to generate a chirp sequence which provides a frequency ramp that forms the radar signal 180. The antenna 170 transmits the radar signal 180 in the proximity of the radar system 100 including towards the object that reflects the signal as reflected signal 182.

The FMCW 110 provides the PLL output signal to the mixer 140. The receiver antenna 120 conveys the reflected signal 182 pulse to the low-noise amplifier (LNA) 130, which amplifies the reflected signal and provides the amplified signal to the mixer 140 The mixer 140 then mixes the FMCW signal with the amplified reflected signal 182 and provides the mixed signal to the low-pass filter (LPF 150). Based on the mixed signal, the LPF 150 generates an output signal indicative of the distance of the object. For example, in at least some embodiments the frequency of the output signal of the LPF 150 is proportional to the distance to the object.

The resolution of the distance indicated by the output signal is based on the frequency bandwidth of the output signal of the FMCW 110, as indicated by the following formula:

$$dr = \frac{c}{2BW_{chirp}}$$

where dr is the resolution, c is the speed of light, and $BW_{chirp}$ is the bandwidth of the output signal of the FMCW 110. Accordingly, to support good distance resolution, in operation the FMCW 110 is configured to repeatedly sweep the output signal across a specified frequency range. Each sweep takes place during a period of time referred to as a chirp period, and each chirp period, as described further below, is composed of an acquisition portion, during which the signal is swept over the frequency bandwidth, and a reset portion during which the PLL is reset to an initial state so that another frequency sweep can be initiated. During the reset period, the PLL consumes system resources (such as power) but the radar system 100 is unable to determine distance to the object. Accordingly, it is typically desirable to reduce the length of the reset period, the dwell phase time, and a settling time.

Accordingly, to reduce the reset period, the FMCW 110 is configured to employ an injection current and gear switching, wherein during each acquisition phase the bandwidth of the PLL circuit is maintained at a relatively low level by providing relatively high capacitance from a set of PLL low pass filter (LPF) capacitors and relatively low current from a PLL charge pump. During each reset portion the configuration of the PLL is changed so that the LPF capacitors provide a relatively low capacitance and the charge pump provides a relatively high level of current, thus setting the PLL bandwidth to a relatively high level. By employing gear switching to change the bandwidth of the PLL circuit during the different portions of each chirp period, the length of the reset period is reduced, thus improving overall efficiency of the radar system 100 while maintaining good performance.

Figure 2:
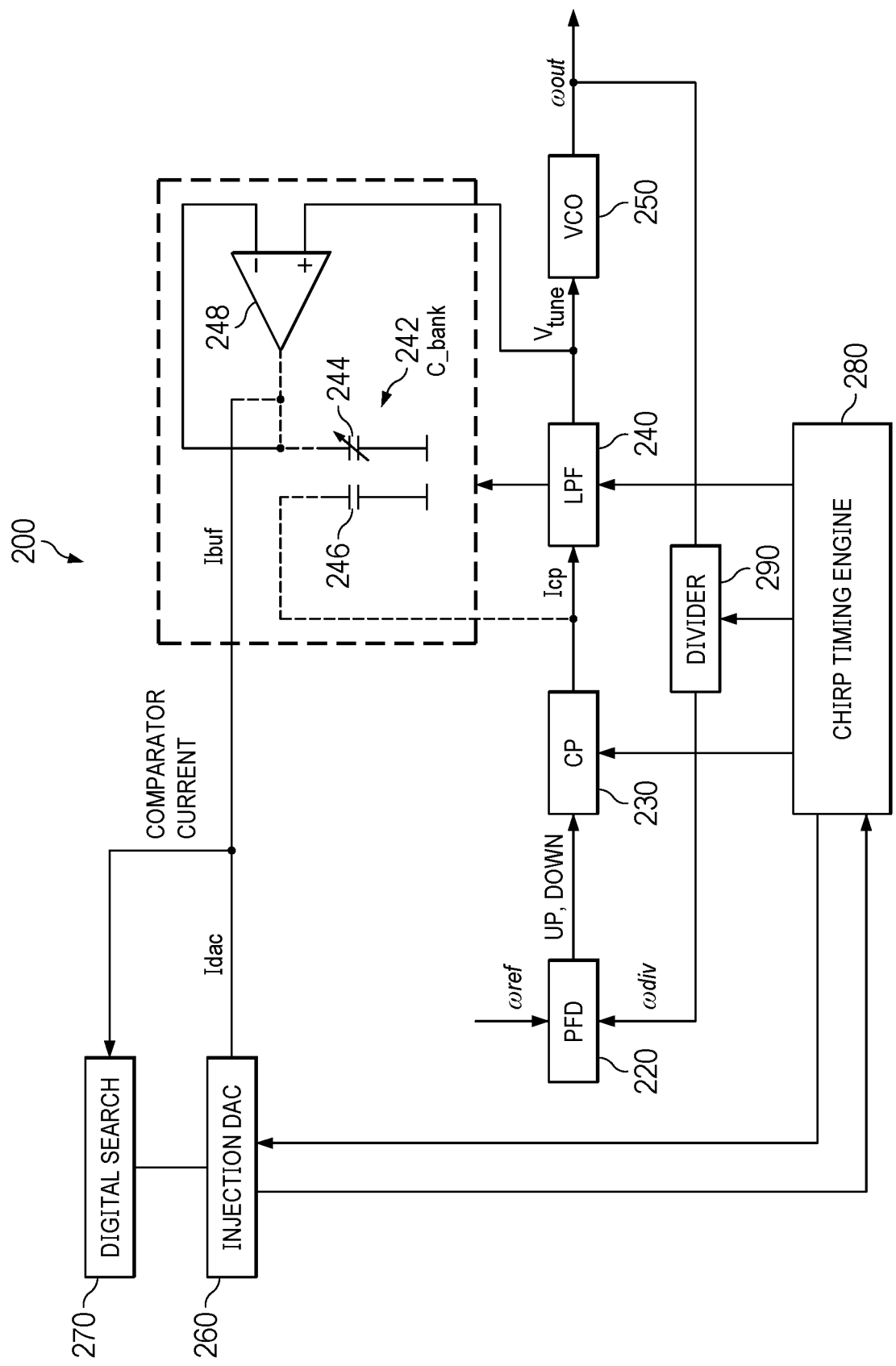
FIG. 2 is a block diagram of a phase-locked loop (PLL) circuit of the FMCW generator of FIG. 1 in accordance with some embodiments.

FIG. 2 is a block diagram of a PLL circuit 200 for use in a radar system according to some embodiments. In some embodiments, the PLL circuit 200 is employed within the FMCW generator 110 of the radar system 100 of FIG. 1 to generate a chirp sequence. The chirp sequence provides a defined frequency ramp which is used to create the radar signal 180 for the radar system 100. The PLL circuit 200 includes a phase frequency detector (PFD) 220, charge pump (CP) 230, a low-pass filter (LPF) 240, a voltage controlled oscillator (VCO) 250, and a divider 290. Together, these components form a feedback loop so that the output signal $\omega_{out}$ has a fixed frequency and phase relationship to a reference signal $\omega_{ref}$. To illustrate, the VCO 250 generates the output signal ωout, based on a signal $V_{tune}$. To generate the signal $V_{tune}$ the PFD 220 measures the difference between, comparing the frequency of a signal $\omega_{div}$ to a frequency of the reference signal ωref. The reference signal ωref is a signal having a constant and known frequency. Based on the difference in the frequency of the input signals, the PFD 220 provides an error signal designated "Up, Down", to the CP 230. Based on the error signal, the CP 230 increases or reduces the charge of a signal designated "Icp" and provides the Icp signal to the LPF 240, which filters the Icp signal to generate the signal $V_{tune}$.

In some embodiments, the output of the VCO 250 ωout is provided to the divider 290 which changes the frequency of the VCO 250 output signal ωout to generate the signal so that the signal $\omega_{out}$ has a divided frequency with respect to the signal $\omega_{out}$. is then provided to the PFD 220. The PFD 220 performs actions to adjust the VCO 250 to make sure the output frequency ωout is correct based on its measurement of the divided frequency ω div. As discussed below, in some embodiments, the PFD 220 adjusts the output frequency of the VCO 250 through the CP 230 and the LPF 240.

As discussed above, the VCO 250 provides an output signal with an output frequency ωout that is divided by the divider 290 which sends the divided signal with the divided frequency ω div to the PFD 220. In at least one embodiment, the PFD 220 measures the divided frequency against the reference signal ωref to correct frequency variations from the reference signal ωref. In some embodiments, the PFD 220 reacts to variations from the reference signal ωref and provides up/down signals to the VCO 250 to effect the changes in its output frequency ωout. In at least one embodiment, the CP 230 performs this correction by outputting a charge current $I_{cp}$ to the LPF 240 which then submits a tuning voltage $V_{tune}$ to the VCO 250. Thus, in some embodiments, the VCO 250 is controlled by the tuning voltage $V_{tune}$. In an example when the PFD 220 observes the output frequency ωout, via the divided frequency ω div, is too low when compared to the frequency of the reference signal ωref, the PFD 220 provides an up instruction to the CP 230, which in turn causes the LPF 240 to provide a positive voltage to the VCO 250, thereby causing the VCO 250 to increase its frequency. In another example, the LPF 240 provides a negative voltage to the VCO 250 in response to a down instruction from the PFD 220 to the CP 230 when the PFD 220 observes the output frequency ωout is high when compared to the frequency of the reference signal ωref.

Similarly, in another example when the PFD 220 observes the output frequency ωout, via the divided frequency ω div, is too high when compared to the frequency of the reference signal ωref, the PFD 220 provides a down signal to the CP 230 which sends a negative charge current $I_{cp}$ to the LPF 240. As a result, the LPF 240 provides a negative tuning voltage $V_{tune}$ to the VCO 250 to cause the VCO 250 to decrease its frequency ωout. As can be observed, in at least one embodiment, the control of the output of PLL circuit 200 can be accomplished simply by changing the value by which the divider 280 divides, or in some instances, multiplies the output of the VCO 250 before feeding the divided frequency ω div to the PFD 220.

In some embodiments, the LPF 240 includes, as illustrated within the box defined by long, dashed lines of FIG. 2, a buffer 248 connected with a bank of capacitors 242 including first and second capacitors 244 and 246. First and second capacitors 244 and 244 can represent one or more capacitors grouped together within the arrangement in the PLL 200. In some embodiments, the buffer 248 acts to copy a voltage, which as illustrated in FIG. 2, is the tuning voltage $V_{tune}$ from within the VCO 230 itself after the charge current $I_{cp}$ is received from the CP 220. In some embodiments, the buffer 248 receives the tuning voltage $V_{tune}$ at its non-inverting input, designated by the "+" sign. The buffer 248 also receives its own output at its inverting input, designated with a "−" sign. In some embodiments, the output from the buffer 248, called the buffer current $I_{buf}$, is provided to the digital search engine 270 during a calibration phase to be measured. In effect, the calibration results in current injection values equivalent to a CP current that effectively creates a frequency ramp for the chirp. During an operational phase, the buffer current $I_{buf}$ is provided to the first capacitors 244 of the capacitor bank 242 by the injection DAC 260, as described further below. In some embodiments, the buffer current $I_{buf}$ is provided according to a chirp injection current profile which was determined by the calibration phase.

In operation, the LPF 240 also removes noise and unwanted frequencies that may occur and that may distract the PFD 220. In some instances, the reference signal ωref could be noisy while in other instances, the PFD 220 itself may introduce noise. In some embodiments, the LPF 240 also acts to stabilize the PLL circuit 200 itself by changing the PLL circuit's response to transients. While in some examples, it may be preferable to have a slow frequency change, necessitating a narrow loop bandwidth, in the PLL circuit 200 in other instances, a fast PLL circuit response, requiring a wide loop bandwidth, may be desired. As discussed further below, gear switching includes changing the capacitance of capacitors, such through as the capacitor bank 242, within the LPF 240 can effectuate these changes in PLL circuit 200 bandwidth, along with adjusting the charge pump current.

Additional elements, such as the divider 290 can help the PLL circuit 200 produce different frequencies by changing the input given to the PFD 220. In operation, the divider 290 gives the PLL circuit 200 the ability to produce frequencies different than that of the reference signal ωref. For example, if a 60 Hz reference signal is provided as the reference signal ωref and it is desired for the PLL circuit to output a frequency ωout of 240 Hz, the divider would divide the ωout frequency from the VCO 250 by a factor of 4. The result of this division would result in the PFD 220 observing a nominal 60 Hz output from the VCO 250 and measuring that frequency against the reference signal ωref. Thus, in this example, if the VCO 250 were to output a 244 Hz signal, the PFD 220, would observe that the divided frequency ω div is a 61 Hz signal and the PFD 220 would begin signaling the CP 230 with a down signal to start lowering the tuning voltage $V_{tune}$ provided to the VCO 250 to slow down its output frequency ωout.

In addition, as discussed above, the PFD 220 is provided with the reference frequency ωref and a divided frequency ω div output from the divider 290. The PFD 220 provides an up, down signal to the CP 230 based on the deviation of the divided frequency ω div from the reference frequency ωref. The CP 230 outputs a charge current $I_{cp}$ to the LPF 240 which then submits a tuning voltage $V_{tune}$ to the VCO 250. Thus, the VCO 250 is controlled by the tuning voltage $V_{tune}$. Before the chirp sequence in the operational phase, the tuning voltage is set to a starting value $V_{tune\_start}$ to ensure the chirp starts at a proper frequency. In some embodiments, as discussed below the PLL circuit 200, through the injection DAC 260 and the divider 290 creates frequency chirps through the VCO 250 that start at a start frequency $f_{start}$ and the tuning voltage $V_{tune}$ starting value of $V_{tune\_start}$.

Thus, the PLL circuit 200 is able to create different output signals having different output frequencies ωout. As discussed above, in some embodiments, the PLL circuit 200 creates a frequency ramp for use in radar systems employing, for example, the FMCW generator 110 of FIG. 1, to provide a frequency chirp to supply the signal needed for the frequency sweep being output as a signal across a specified frequency range. A frequency chirp output from the PLL circuit 200 in the FWCW generator 100 will form the radar signal being amplified by the PA 160 and then emitted by the antenna 170. In some embodiments, to generate this frequency chirp, the chirp timing engine 280 within the PLL circuit 200 organizes the various elements of the PLL circuit 200 to employ both gear switching and a calibrated injection current via a chirp injection current profile. The use of gear switching allows the PLL circuit 200 is change its bandwidth as necessary. The use of the calibrated injection current profile further refines the accuracy of the frequency ramp for the frequency chirp in the acquisition phase. In some embodiments, the chirp timing engine 280 controls the injection DAC 260 to create the frequency ramp via the chirp injection current profile provided to the PLL capacitors 244 of the LPF 240. That is, the chirp injection current profile is the current output by the injection DAC 260 to create an accurate frequency ramp for a chirp in the acquisition phase. In some embodiments, the chirp timing engine can control the capacitance values of the capacitors in the capacitor bank 242 of the LPF 240 to further change the bandwidth of the PLL circuit 200. In some examples, the chirp timing engine 280 introduces a programmable delay that can be advanced or delayed as required for an optimal timing for the chirp and to account for possible delays arising between analog and digital elements of the PLL circuit 200 system.

In some embodiments, the chirp timing engine 280 also performs calibration of the injection current to create the calibrated injection current for the functional chirp which may be referred to as a chirp injection current profile. In a calibration operation of the PLL circuit 200, the PLL is closed and operates at the intended bandwidth for the chirp. In addition, first capacitors, such as the first capacitors 244 of the LPF 240 which are fed by a buffer current, as in a normal chirp operation. Next, an injection current is compared to a buffer current $I_{buf}$ in the PLL capacitors 246. As explained below, the digital search engine 270 tracks the injection current to the buffer current to ultimately create the chirp injection current profile based on the injection current and measured buffer current.

In some embodiments, after the calibration phase is finished, the chirp timing engine 280 provides the injection settings, or the calibrated chirp injection current profile, to the injection DAC 260 to be used in the operational phase. As discussed above, the timing engine 280 can coordinate the analog and digital portions of the PLL circuit 200 to provide an accurate frequency sweep in the acquisition timing portion of the chirp and to reduce settling time and reset time within the chirp cycle. In some embodiments, in the operational chirp phase, the chirp timing engine 280 directs the injection DAC 260 to adjust its output to feed a current into the PLL capacitors 246 of the capacitor bank 242 of LPF 240 used as a part of the PLL 200 to create the frequency ramp from the start frequency $f_{chirp,start}$ to the stop frequency $f_{chirp,stop}$, as well as reducing the reset phase period.

Thus, embodiments of the invention perform a calibration phase to determine injection current values that are equivalent to an effective charge pump current along the desired chirp slope of the PLL circuit 200. The chirp timing engine 280 can then use the resulting chirp injection slope profile to control the elements of the PLL circuit 200, including the injection DAC 260, the divider 290, CP 230, and LPF 240 to create the frequency chirp during an operational phase. The frequency chirp is therefore initiated with a current profile that will reduce reset and settling time. In doing so, embodiments of the invention can account for chirp parameters and process and temperature variations, as well as non-linearity or other errors that may occur within the VCO 250. Furthermore, the calibration phase is performed in closed loop under the same conditions as the actual closed loop condition of the chirp process itself. In some embodiments where the closed loop system PLL is used to generate the FCMW signal, the chirp timing engine 280 preforms an error analysis is to determine which bandwidth is needed to guarantee a certain frequency error of its control system. Thus, the calibration process avoids additional costs that may arise from an open loop calibration of the PLL circuit 200 and is autonomous, not requiring additional external communications or assistance, which reduces the complexity of the system and time necessary to calibrate the PLL 200.

In at least one embodiment, the LPF 240 includes a capacitor bank 242. In some embodiments, the capacitor bank 242 includes first capacitors 244 and second capacitors 246 which are connectable as part of the PLL of the PLL circuit 200. It can be appreciated that the capacitor bank can includes any number of different capacitors which can be switched as desired from the PLL to a buffer 248 in operation. In one embodiment, the first capacitors 244 are charged by the buffer current $I_{buf}$ provided by the buffer 248. FIG. 2 illustrates the capacitors 244 and 246 can be connected to the PLL as illustrated via the dashed lines. In at least one embodiment, as discussed below in FIGS. 3-5, the various capacitors 244 and 246 of the capacitor bank 242 will be switched on command to be connected to either one of the PLL 200 or the buffer 248.

As discussed further below, in some embodiments, there are two loop configurations, a high bandwidth configuration and a low bandwidth configuration. These configurations are achieved by connecting a low capacitance, where in some examples the second capacitor 246 has a lower capacitance value, and a high capacitance, where in some examples, the first capacitor 244 has a higher capacitance value, in the loop. The other capacitance (i.e., the capacitors not used in the loop at that time) is charged by the buffer 248.

In the calibration phase, the smaller dashed lines show the CP current $I_{cp}$ is provided to the PLL via capacitor 246. In addition, in the calibration phase, the first capacitors are fed by the buffer current $I_{buf}$ as shown by the long-short, dashed lines. During the calibration phase, the injection DAC 260 is not providing a current to feel the PLL but instead it is being compared to the resulting buffer current $I_{buf}$ by the digital search engine 270. The profile generated by the digital search engine 270 is then used to generate a calibrated chirp injection current profile for the PLL circuit 200 during an operational phase. In some embodiments, the chirp injection current profile matches a charge pump current from the CP 230 that produces the desired chirp slope. After the calibration phase, in the operational phase, the digital search engine 270 communicates with the chirp timing engine 280 to provide the resulting chirp injection current profile so the chirp timing engine can direct the injection DAC 260 to use the chirp injection current profile for injection of a calibrated current into the LPF 240.

Next, in some embodiments, in the operational phase, the first capacitors 244 and second capacitors 246 switch places, as the first capacitors 244 are used in PLL 200 and the second capacitors 246 are fed by the buffer current $I_{buf}$ from the buffer 248. In the operational phase, the DAC current $i_{dac}$ from the injection DAC 260 is provided to first capacitors 244 while second capacitors 246 are charged (through the buffer 248) to a same voltage as $V_{tune}$. During the reset phase, the second capacitors 246 will be used for high PLL bandwidth mode and because the second capacitors 246 are pre-charged to a same voltage as the $V_{tune}$ signal, this transition will happen fast and without any glitching or settling. In addition, the digital search engine 270 is disabled. In addition, the current required to generate a desired chirp slope is available in digital search engine 270 as generated profile for the chirp.

Figure 3:
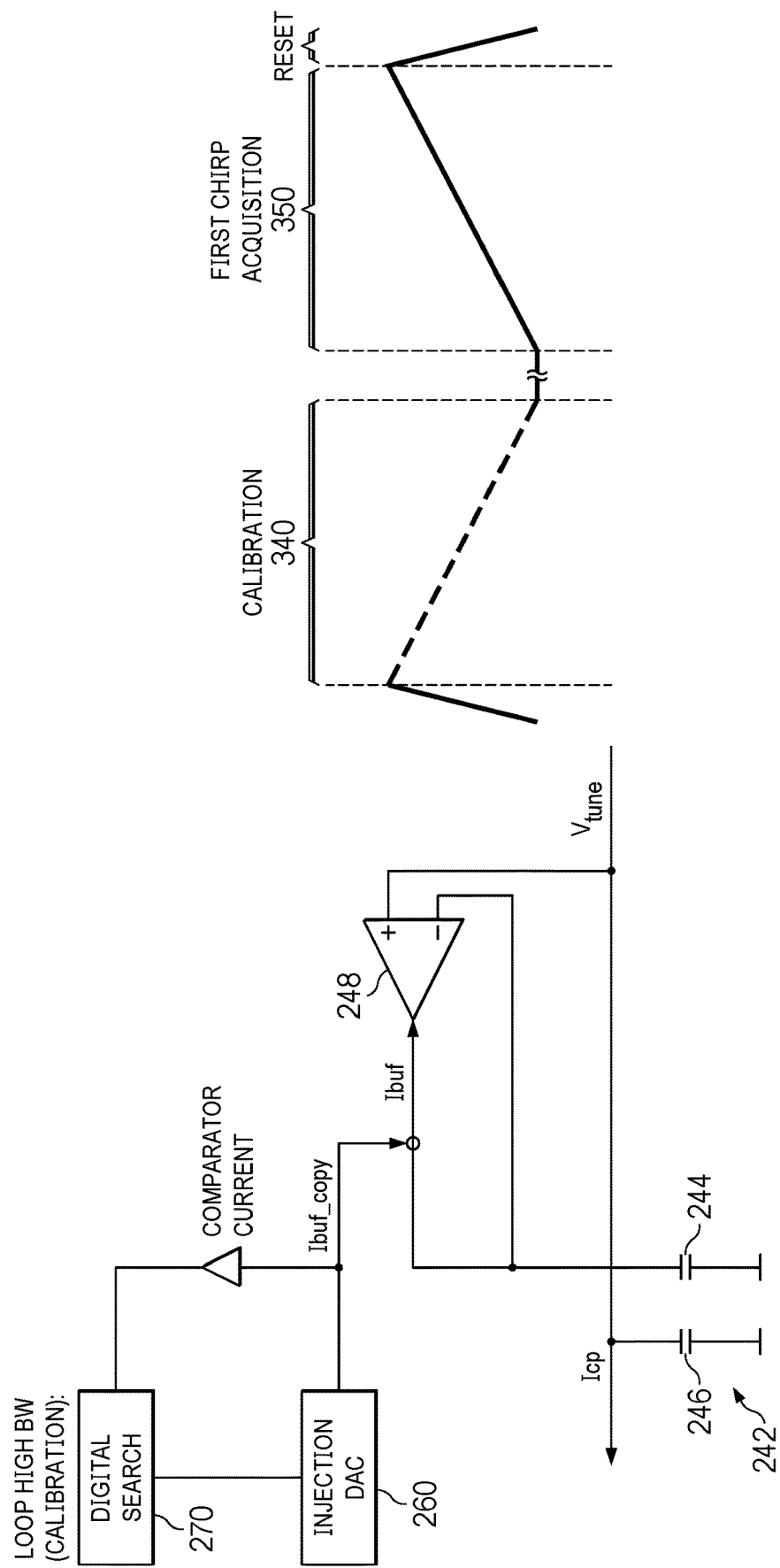
FIG. 3 is an illustration of calibrating the chirp injection current profile associated with the PLL circuit of FIG. 2 in accordance with some embodiments.
Figure 4:
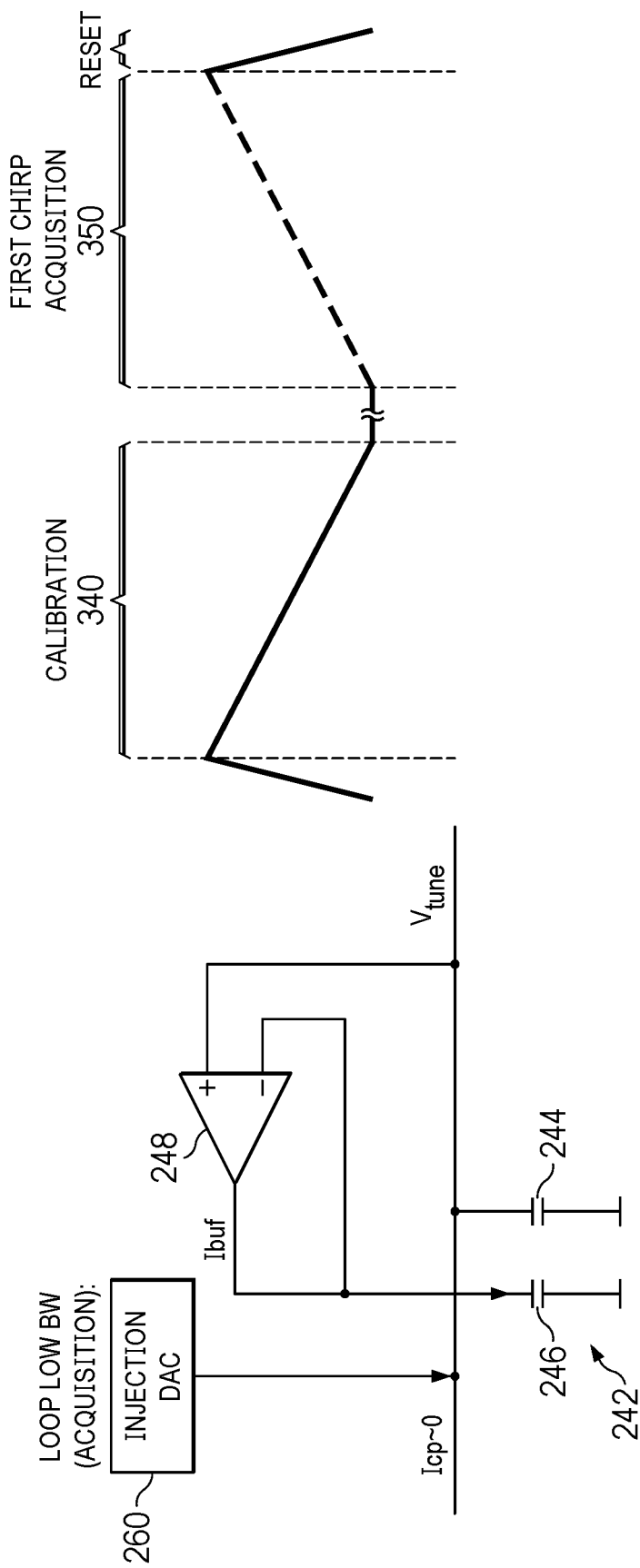
FIG. 4 is an illustration of an acquisition phase associated with the PLL circuit of FIG. 2 in accordance with some embodiments.
Figure 5:
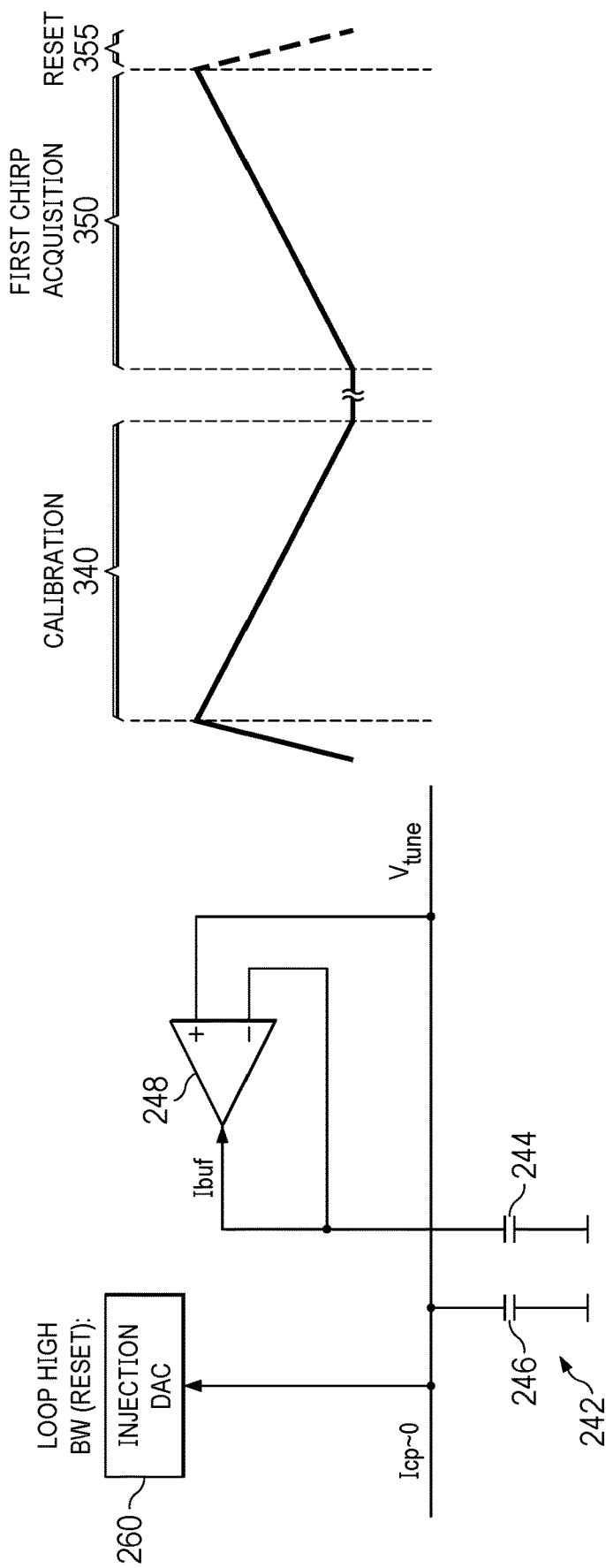
FIG. 5 is an illustration of a reset phase associated with the PLL circuit of FIG. 2 in accordance with some embodiments.

FIGS. 3-5 illustrate the different bandwidth configurations of the PLL circuit 200 of FIG. 2 during the calibration, acquisition, and reset phases in accordance with some embodiments. FIG. 3 is an illustration of the PLL circuit 200 in a high bandwidth configuration. In some embodiments, the high bandwidth configuration occurs during the calibration phase. During the calibration phase, no output signal is transmitted. In the calibration phase, the PLL is locked and the VCO tuning voltage Vtune is shaped by the loop in order to produce an intended frequency ramp at the VCO output. This frequency ramp is represented as a calibration ramp 340 for the calibration phase. In addition, the buffer 248 is copying the Vtune ramp on capacitor 246. The copy of the buffer output current $I_{buf}$ is provided to an ADC provided in the IDAC, or injection DAC, 260. In some examples, the buffer output current $I_{buf}$ may be referred to as a test current. In addition, the calibration ramp 340 has an opposite shape from the ramp of the functional chirp 350. That is, in some embodiments, the calibration ramp is reversed from the intended frequency ramp. By reversing the calibration ramp, the buffer current $I_{buf}$ is the same as during the acquisition phase. In addition, the calibration loop settles at the start frequency for the acquisition phase. Accordingly, settings for the injection DAC 260 are thus set at the proper calibration points.

During the calibration phase, the IDAC 260 works to match the current from the first capacitors 244 which is needed to produce the intended frequency ramp at the VCO output during the acquisition phase. The calibration phase also provides the reset phase injection current after applying a correction factor by the digital engine. In some examples, the accuracy for the reset phase calibration current is less demanding than that required for the acquisition phase injection current. As such, application of the correction factor itself is sufficient for the reset injection current. During the dummy chirp of the calibration phase, capacitor 244 is charged by Vtune through the buffer 248 and the buffer current $I_{buf}$ provided by the buffer 248 is extracted, from which a chirp current profile is derived, which is representative of the chirp slope for the intended frequency ramp. This current is typically constant during the dummy chirp and injection DAC 260 is calibrated to this current. Although, in some examples, the current may include non-linearities, and other deviations such as temperature, for which the calibration compensates.

FIG. 4 is an illustration of the PLL in a low bandwidth configuration. In some embodiments, the low bandwidth configuration is for the acquisition phase which takes place after the calibration phase is complete. In this example, the PLL has switched from the high bandwidth mode to a low bandwidth mode. In the acquisition phase, the first capacitors 244 are connected to the PLL and the PLL is operating at its intended start frequency. In addition, the injection DAC 260 outputs a current $i_{dac}$ that matches the current needed to shape the first capacitors 244's voltage in order to produce the intended frequency ramp at the VCO output as illustrated by the first acquisition chirp ramp 350.

FIG. 5 is an illustration of the PLL in a high bandwidth mode during the reset portion of the chirp. During the reset portion 355, the frequency of the PLL is returned to its starting frequency as illustrated by the reset ramp 355. In this example, the PLL switches to the high bandwidth mode where capacitor 246 is in the PLL. When the reset portion is complete, the next chirp cycle can start. Because of the calibration phase 340, in some embodiments, multiple chirp cycles can be repeated without another calibration until the chirp parameters or other environmental factors affect the PLL's performance change.

Figure 6:
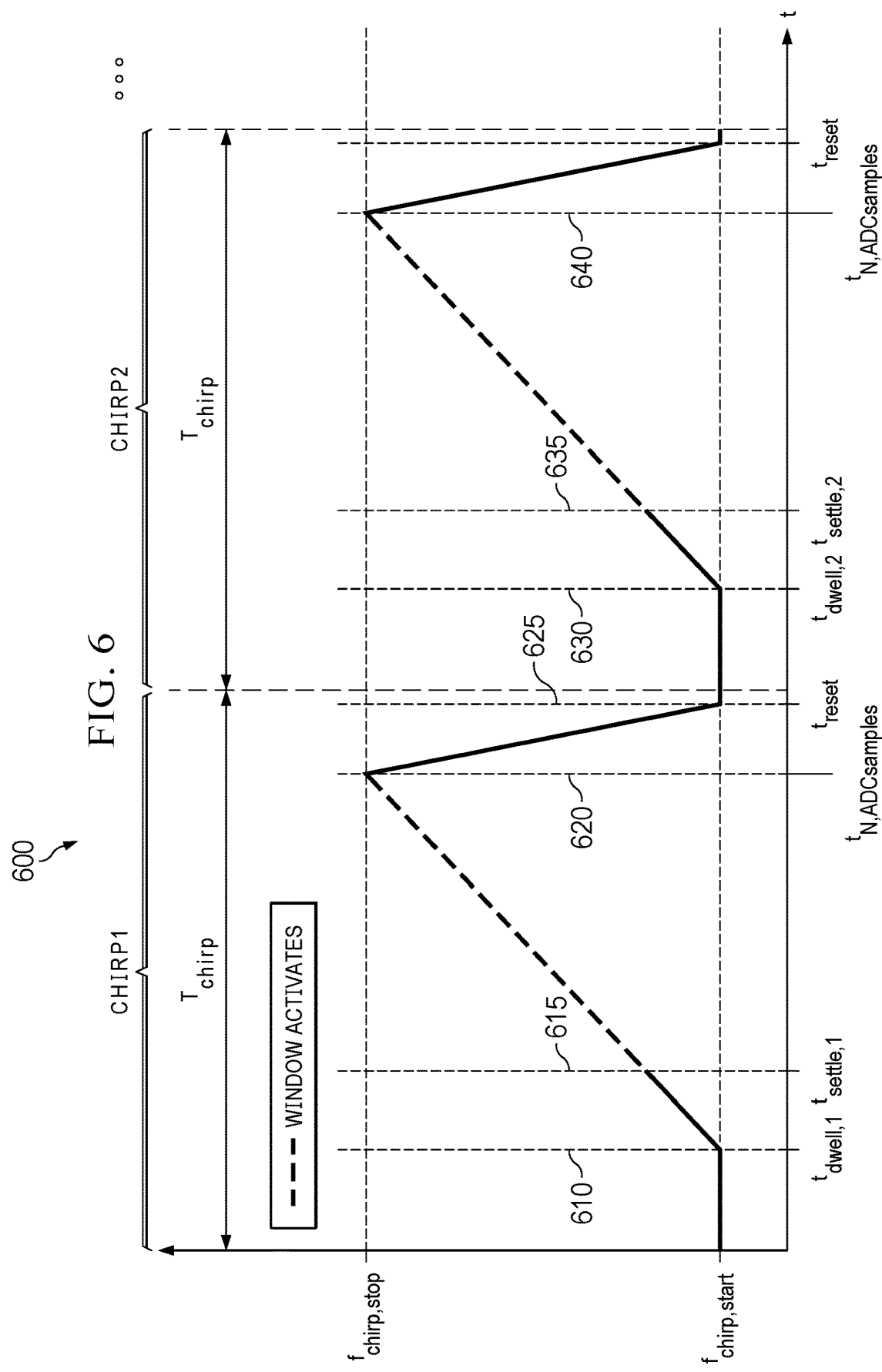
FIG. 6 is an illustration of creating a set of chirp periods associated with the PLL circuit of FIG. 2 in accordance with some embodiments.

FIG. 6 is an illustration of creating a frequency chirp with certain frequency bandwidth (FMCW) signal as performed by some embodiments of the FMCW circuit 110 of FIG. 1 and employing the PLL circuit 200 of FIG. 2. In some embodiments, an operational chirp is produced in the operational phase, or chirp sequence. Thus, in FIG. 5, the operational phase described above with respect to the PLL circuit 200 of FIG. 2 is illustrated.

FIG. 6 illustrates the process 600 of producing a chirp sequence containing two consecutive chirp signals by the PLL circuit 200 of FIG. 2. The first chirp signal includes a ramp up region which begins at a start frequency $f_{chirp,start}$ 610 and then the frequency of the chirp increases at certain rate until it reaches the stop frequency $f_{chirp,stop}$ 620. As can be observed, the first chirp cycle begins in a dwell phase that ends at the time marked $t_{dwell,1}$ 615 for the dwell phase. The acquisition phase begins at the start frequency $f_{chirp,start}$ 610. Within the acquisition phase, a settle period takes place which ends at $t_{settle,1}$ 615 for the first chirp cycle. At the end of the acquisition phase, which occurs when the first chirp reaches the stop frequency $f_{chirp,stop}$ 620, the reset phase begins as shown at $t_{reset}$. During the reset phase, the frequency of the PLL circuit is reduced from the stop frequency $f_{chirp,stop}$ to the start frequency $f_{chirp,start}$, as illustrated at 625. The reset phase ends at 625 and the second chirp cycle starts at 630 with $t_{dwell,2}$ leading to the second acquisition phase and the second settle portion $t_{settle,2}$ at 635 until the next $t_{reset}$ at 640. During the chirp cycles, $t_{N,ADCsamples}$ show the portion of the acquisition phases from which useful data can be collected, such as by an analog-to-digital converter (not shown) that is employed by the radar system 100 to process the output signal from the LPF 150.

In an operation of a radar system employing PLL circuit 200 of FIG. 2, for example, the ramp up region, as illustrated for example with a dashed line and marked as "window activates", is utilized to extract information from the reflected radar signal. The extracted information can include information about distance, speed, and acceleration. This region forms the acquisition region, because this portion of the chirp cycle when the radar system can acquire useful data. The reset time is required by the PLL circuit after the ramp-up region to bring the frequency of the PLL circuit, in this case the frequency being output by the VCO 240 of FIG. 2, back to the start frequency. In addition, a dwell time is necessary because time is also required for the PLL circuit to be ready to initiate the next ramp-up phase once the PLL circuit is back to the start frequency $f_{chirp,start}$. In addition, a settle time within the ramp-up region is another period of time likewise required before the actual acquisition phase begins. The reset slope determines the phase noise performance of the PLL circuit. During the reset phase, gear switching is employed to increase the PLL bandwidth. In some examples, the PLL bandwidth is increased by a factor of 8. In additional embodiments, the injection DAC 260 of FIG. 2 would introduce a calibrated injection current, or chirp injection current profile, to further reduce the settling time. Ideally, the chirp reset time and settling time should be as short as possible in order to reduce the total period of time necessary to produce the frequency chirp as this would effectively result in a better dynamic range of the radar system and lower power consumption. If the reset slope increases while PLL bandwidth is kept constant, the phase difference during the reset phase will increase, where the dynamic range of a phase frequency detector-charge pump, such as the PFD 220 and CP 230 of FIG. 2, will be reached and a cycle-slip will occur, meaning that the reset time in a closed loop system would take longer than if the PLL bandwidth was increased.

Figure 7:
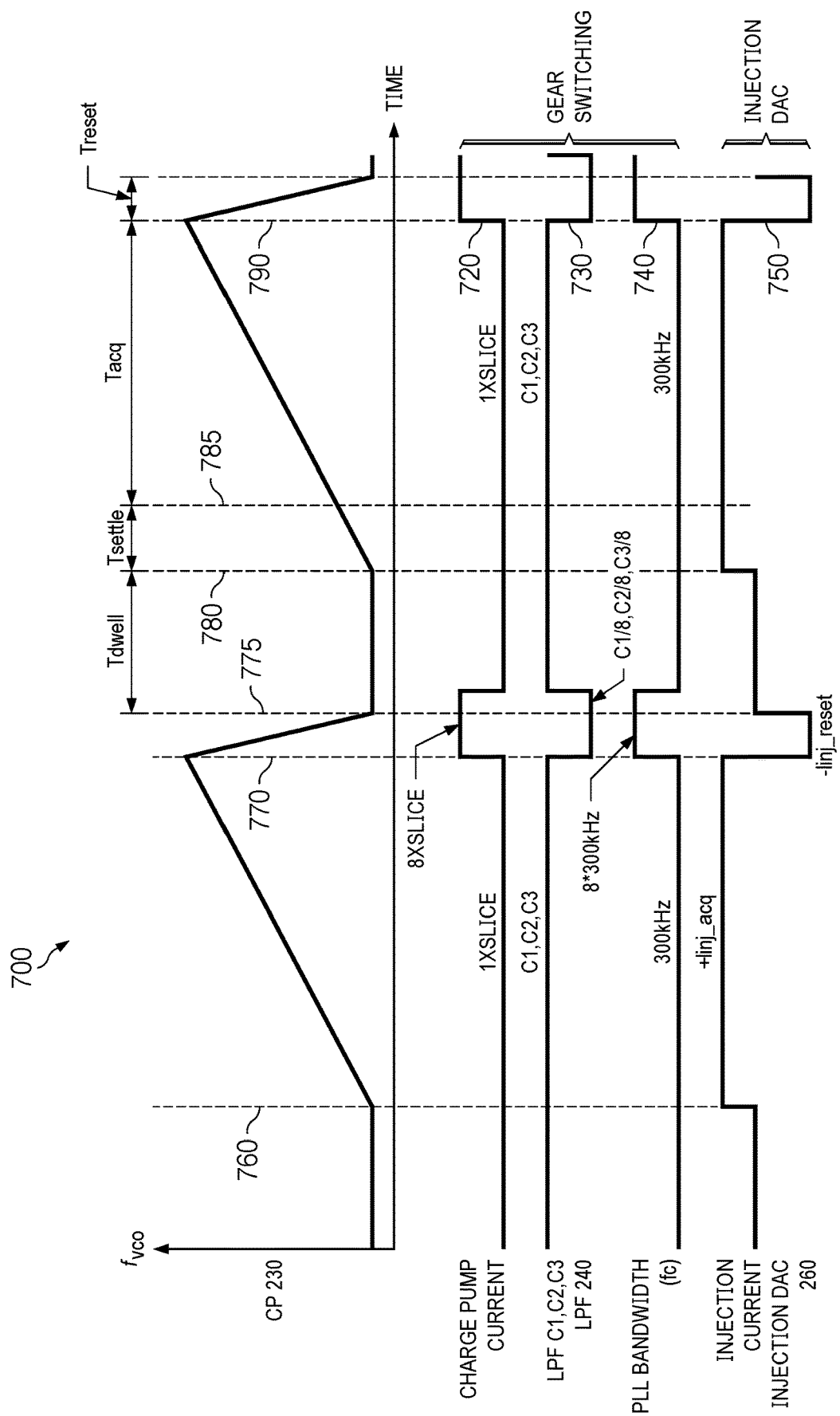
FIG. 7 is an illustration of applying a chirp injection current profile and gear switching to generate a calibrated chirp at the PLL of FIG. 2 in accordance with some embodiments.

FIG. 7 is an illustration of creating a frequency chirp signal 700 in embodiments of the PLL circuit 200 of FIG. 2. FIG. 7 illustrates the concepts of gear switching and injection current calibration that have thus far been discussed and how these techniques are used to reduce the reset time and settling time of a frequency chirp cycle within a PLL circuit, such as the PLL circuit 200 of FIG. 2, and as further shown in the chirp signals 300 of FIG. 3. Referring to FIG. 7, the PLL circuit signal 710 is an example of a frequency chirp cycle and the chirp's frequency is shown changing across a time period for two chirp cycles to occur. Thus, the acquisition phase begins, as illustrated with the time 760, and ends at time 770. After the time marked 770, the reset phase begins, and continues until time 775. As discussed below, various changes take place to make this portion of the frequency chirp cycle as short as possible. Next, as illustrated between time 775 and time 780, the dwell phase takes place. Time 780 illustrates the start of another acquisition phase that ends at time 790. The settling time is also illustrated as taking place between time 780 and the portion illustrated by reference number 785 on the time axis.

In some embodiments, referring to the PLL circuit 200 of FIG. 2, the chirp timing engine 270 instructs the LPF 240 to change the capacitance of the second capacitors 244 within the capacitor bank 242. In addition, the CPO 230 issues a charge pump current. In some embodiments, the injection DAC 260 provides an injection current according to the chirp injection current profile to the LPF 240. In some embodiments, the chirp timing engine 280 also controls the CPO 230, LPF 240, VCO 250, and other elements of the PLL circuit 200 during the chirp cycle according to the chirp injection current profile. In this example, the second capacitors 244 include three separate capacitors that are variably connected in the PLL 200 or the buffer 248, resulting in variable capacitance values C1, C2, and C3, the capacitance values of which are illustrated by the time marked 430. In some embodiments, the acquisition phase calibration of the injection current is individually performed for each of capacitors C1, C2, and C3. The individual calibrations for capacitors C1, C2, and C3 are performed in parallel during the same calibration phase. In other embodiments, individual capacitors of capacitors C1, C2, and C3 can be omitted from the calibration sequence, such as in examples where a capacitance value of one of the capacitors C1, C2, and C3 is relatively small compared to system performance.

FIG. 7 further illustrates the bandwidth of the PLL circuit at the time marked 740. In some embodiments, the gear switching achieves a low PLL bandwidth 740 during an acquisition phase, as illustrated by the region between times 760 and 770. The low PLL bandwidth 740 is achieved by employing a high capacitance value 730 at capacitors C1, C2, and C3 and a low charge pump current 720. In addition, during the reset phase, as illustrated by the region between time 770 and 775, a high PLL bandwidth 740 is induced by switching the capacitance values 730 of capacitors C1, C2, and C3 to a low value while increasing the charge pump current 720 to a high value. In at least one embodiment, the capacitance switching is performed by connecting and disconnecting some of the capacitors to be part of the PLL while others are charged by the buffer current. In some embodiments, during the reset phase, ⅛th of the LPF's capacitor bank 242 will be part of the PLL and the remaining $\frac{7}{8}^{th}$ of the capacitance value will be charged by the buffer current. Similarly, in some embodiments, during an acquisition phase, $\frac{7}{8}^{th}$ of the capacitance value is part of the PLL while the remaining $\frac{1}{8}^{th}$ is charged by the buffer current.

In some embodiments, the chirp timing engine 270 controls the injection DAC 260 of the PLL circuit 200 of FIG. 2 to further reduce the settling time of the ramp-up phase and the rest time of the reset phase. The injection DAC current 750 is provided to each capacitor C1, C2, and C3 to create an accurate voltage ramp during the ramp-up phase. As discussed above, the ramp-up phase includes the settle phase and the acquisition phase. The injection current 750 has a first value during the dwell phase, a second value during the settle phase and acquisition phase of the ramp up phase, and then a third value for the reset phase. In some examples, as the first value occurs during the dwell time portion, the first value may be zero as the slope is zero at that time. The values of the injection current 750 shift from an initial value, such as the first portion illustrated before time 760, to an injection current value for the reset phase $-I_{inj\_reset}$ value, as illustrated in the reset phase shown, for example, between times 770 and 775 and then again after time 790. Next, an injection current value for the acquisition phase, an $+I_{inj\_acq}$ value is illustrated between times 760 and 770 and again between times 780 and 790. In some embodiments, the injection current values 750 are calibrated to achieve a minimal settling time independent of chirp settings, programmed PLL bandwidth, $K_{vco}$, and other process variations, such as the temperature. Furthermore, the calibrated injection current values 750, provided at an accurate time within the ramp up phase, generate the desired chirp slope of the acquisition phase.

Figure 8:
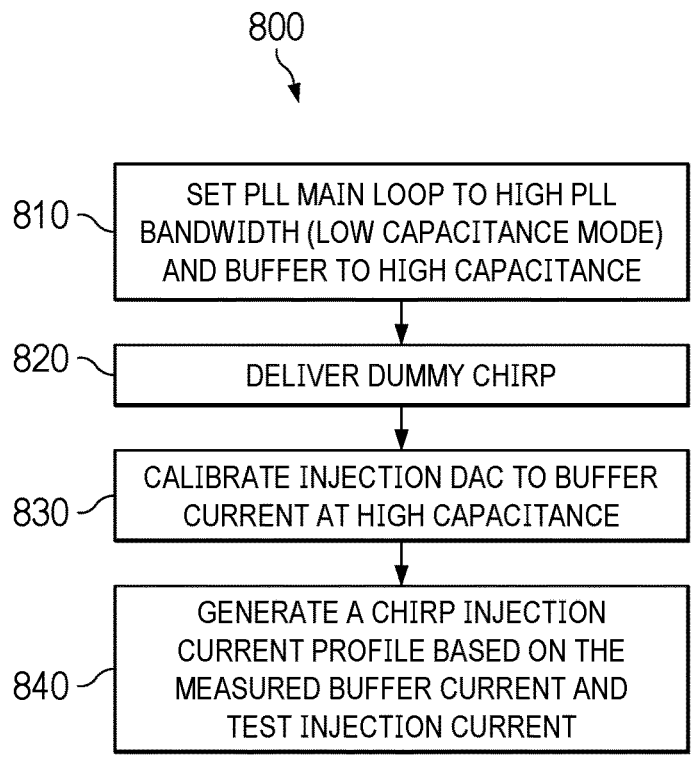
FIG. 8 is a flow diagram illustrating a method for generating a chirp injection current profile at the PLL circuit of FIG. 2 in accordance with some embodiments.

FIG. 8 is a flow diagram illustrating a method 800 of generating a chirp injection current profile. The method 800 is implemented in some embodiments of PLL circuit 200 shown in FIG. 2.

In some embodiments, the injection DAC 260 of FIG. 2 is switched or directed to measure the current in a buffer 248 within the LPF 240, including the first capacitors 242 of the LPF 240. The buffer current is representative of the chirp slope of the dummy chirp during the calibration phase. The injection DAC current $i_{dac}$ is searched until it is equal to the buffer current $I_{buf}$ meaning that it is equivalent to the chirp slope. To begin the calibration phase, at block 810, the PLL main loop is set to a high PLL bandwidth where the capacitance is in a low capacitance value mode, as previously illustrated, for example, in FIG. 3 discussed above. On the LPF 240 buffer side, a high capacitance value is provided. Next, at block 820, the dummy chirp is executed which provides a representative current. As discussed below, this current is used to set the chirp injection profile.

At block 830, the resulting current in the buffer 248 is tracked and measured. In some embodiments, this measurement can produce a chirp current injection profile similar to the illustrated example of FIG. 11 where the injection current is derived from the buffer current. At block 840, the measured buffer current is used to generate the chirp current injection profile based on the measured buffer current. As discussed above, the timing engine 280 of FIG. 2 uses the chirp injection current profile as well as gear switching settings when applicable to direct the operation of the injection DAC 270, CPO 230, LPF 240, VCO 250, and other elements of the PLL circuit 200.

Figure 9:
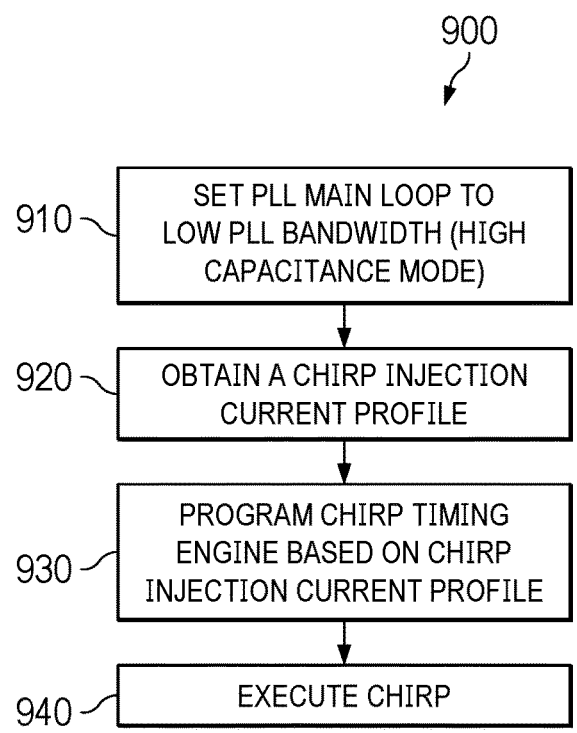
FIG. 9 is a flow diagram illustrating a method for executing a chirp using gear switching and a chirp injection current profile at the PLL circuit of FIG. 2 in accordance with some embodiments.

FIG. 9 is a flow diagram illustrating a method 900 of executing a chirp using gear switching and injection current calibration. The method 900 is implemented in some embodiments of PLL circuit 200 shown in FIG. 2. At block 910, the PLL bandwidth is set to low where a high capacitance mode is engaged, as previously show, for example in FIG. 4. In some embodiments, the process of gear switching includes changing the values of used capacitances in a low pass filter as illustrated, for example, with the capacitance values 730 of C1, C2, and C3 shown in FIG. 7.

In some embodiments, the chirp injection current profile is obtained at block 920. In some embodiments, the chirp injection current profile was determined as illustrated in method 800 of FIG. 8. In block 930, the chirp timing engine is programmed based on the chirp injection profile. In block 940, the chirp is executed. In some embodiments, the chirp matches the execution as shown in FIG. 7 where the injection DAC 260 of FIG. 2 supplies an injection current 750 according to the chirp injection current profile. In addition, the execution of the chirp provides the execution as illustrated by process 600 in FIG. 6 for as many chirp cycles, having accurate frequency ramps and reset phases, as desired.

Figure 10:
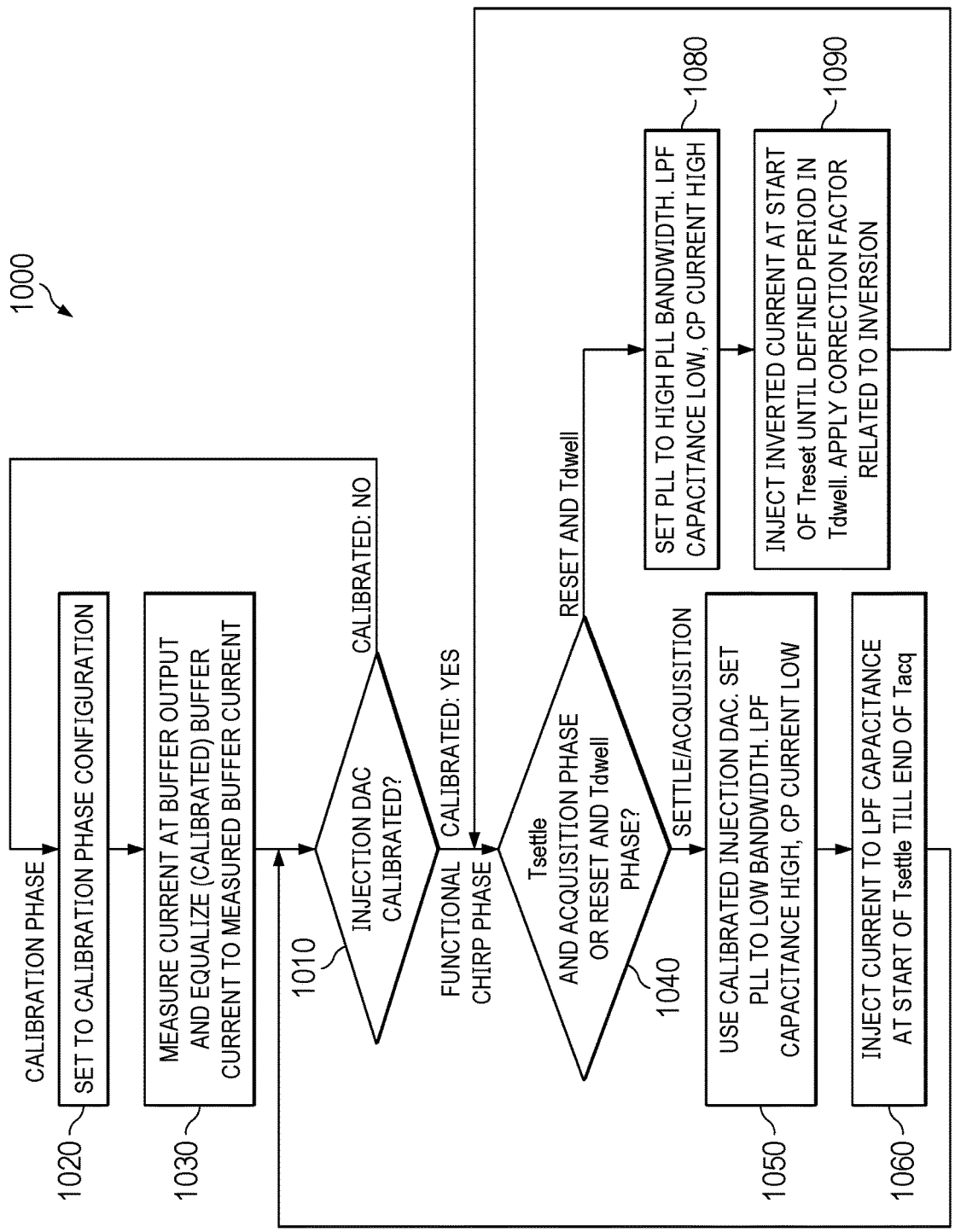
FIG. 10 is a flow diagram illustrating a method for calibrating a chirp injection current profile and executing a chirp at the PLL of FIG. 2 in accordance with some embodiments.

FIG. 10 is a flow diagram illustrating a method 1000 of executing a chirp using gear switching and injection current calibration. The method 1000 is implemented in some embodiments of PLL circuit 200 shown in FIG. 2. At block 1010, it is determined whether the PLL circuit calibrated. If the PLL circuit is not calibrated, meaning the chirp injection profile is current, then at block 1020 the PLL is placed into the calibration configuration and then the buffer current is tracked in block 1030 where the current is measured at the buffer output and equalized (calibrated) buffer current to measure the buffer current to generate the calibrated chirp injection current profile. In some embodiments, the PLL may be considered calibrated for a predetermined number of chirp cycles. In some other embodiments, a change in operating conditions for the PLL may be observed, such as a change in temperature, and the PLL would then be considered not calibrated. The calibration phase of blocks 1020 and 1030 reflect, in some embodiments, the method 800 of FIG. 8 where a dummy chirp is employed to generate a chirp injection current profile.

In some embodiments, where it is determined the PLL circuit 200 is calibrated, method 1000 proceeds to block 1040, for an active chirp cycle, where the current status of the chirp process is evaluated. That is, block 1040 determines whether the active chirp is in the settle and acquisition phase (Tsettle+Acq) or in the reset and dwell phase (Reset+Tdwell). In the reset and dwell phase portion of the functional chirp phase, which corresponds to the beginning step of a chirp process, the PLL bandwidth is set to high at block 1080. In addition, at block 1080, the low pass filter capacitance is set to low and the charge pump current is high. As discussed above, and as illustrated by the capacitance values 730 in FIG. 7, the first capacitance ratio value is the same value for the dwell phase and the ramp up phase In some embodiments of the dwell and acquisition phases, $\frac{7}{8}^{th}$ of the capacitance value of the capacitance bank 242 is provided to the PLL while the remaining $\frac{1}{8}^{th}$ value is charged by the buffer current. At block 1090, in some embodiments, in order to effect a rapid reset portion, an inverted current is injected at the start of Treset until the dwell time. In additional embodiments, a correction factor related to the inversion is applied. Upon completion of the dwell phase, method 1000 returns to block 1040 to evaluate the next step of the chirp process.

At block 1040, when it is determined that the reset and dwell phase has been completed, method 1000 proceeds to block 1050. As discussed above and reflected in the capacitance value variations 730 of the LPF 240 in FIG. 7, the PLL bandwidth is set to a low bandwidth where the LPF 240 has a high capacitance value, and the charge pump current is low. In some examples, the second capacitance ratio value may be set to a value where $\frac{1}{8}^{th}$ of the capacitance value is part of the PLL while the other $\frac{7}{8}^{th}$ is charged by the buffer current as part of the gear switching adjustment of the PLL circuit 200. Next, in block 1060, the injection current is applied to the LPF 240 at the start of Tsettle until the end of the acquisition phase at $T_{acq}$. During the acquisition phase, the antenna 120 of FIG. 1, for example, would be able to obtain a reflection having useful information from a radar pulse 180 emitted by the antenna 170 of radar system 100. Next, method 1000 proceeds to block 1010 to determine if another function chirp phase will be initiated or if a calibration phase is required.

Figure 11:
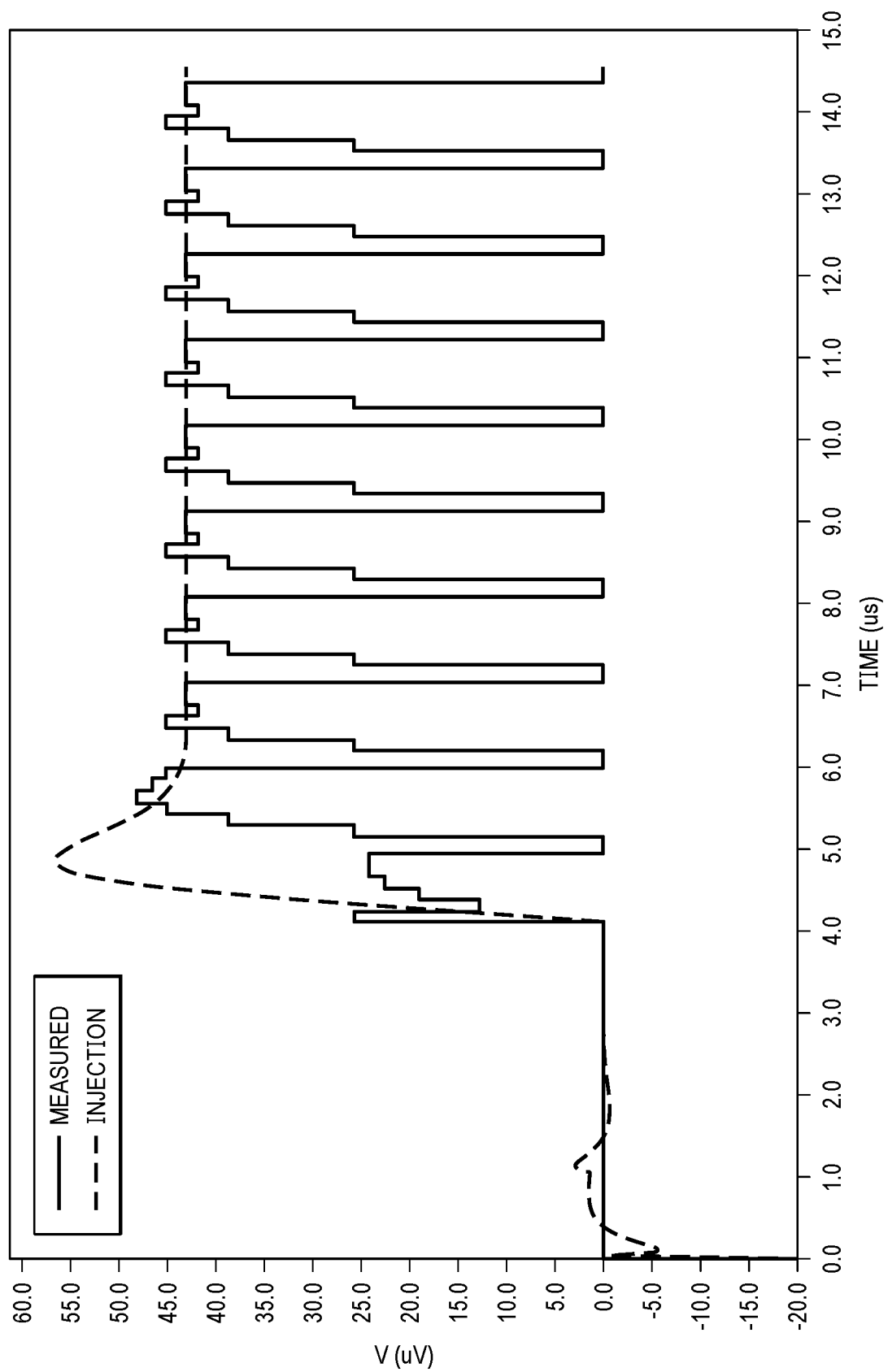
FIG. 11 is an illustration of injection current tracking of a test chirp of FIG. 3 in accordance with some embodiments.

FIG. 11 is an illustration of injection current tracking of a test chirp in accordance with some embodiments of the calibration phase of FIG. 3, for example, being created by embodiments of the PLL circuit 200 of FIG. 2, which in some embodiments, is employed in the radar device 100 of FIG. 1. In the calibration phase of FIG. 3, for example, the current from the buffer can be measured. The buffer current is illustrated with the dashed line while the measured representation of the buffer current is the solid line. Various types of measurement and tracking of the buffer current may be employed. In this embodiment, a binary search is used to create an accurate chirp injection current profile for the Injection DAC 260 of FIG. 1 to program the chirp timing engine 280 with the chirp injection current profile. Thus, the solid line represents the chirp injection current profile which will be used during the functional chirp to generate the acquisition phase. In some embodiments, the calibration focuses on matching closely the current in capacitor 246 needed to generate a voltage slope in order to produce an intended frequency ramp at the VCO 250 of FIG. 2, for example, that is output during the acquisition phase where an exact current matching is employed. That is, in some embodiments, in the illustration of the chirp cycles 700 of FIG. 7 the resulting chirp injection current profile defines the shape of the injection current 750 line.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method, comprising:
 calibrating an injection current of a chirp injection current profile by providing a calibration ramp of a dummy chirp to a first set of capacitors of a capacitor bank of a phase-locked loop (PLL) during a calibration phase of the PLL, wherein the capacitor bank is coupled to a buffer configured to output a buffer current that is used to calibrate the injection current of the chirp injection current profile; and generating a frequency chirp based on the chirp injection current profile during an acquisition phase of the PLL.

2. The method of claim 1, wherein the PLL is in a high bandwidth mode during the calibration phase.

3. The method of claim 1, wherein the PLL is in a low bandwidth mode during the acquisition phase.

4. The method of claim 1, wherein the calibrating comprises:
measuring the buffer current from the first set of capacitors during the calibration phase; and
matching the chirp injection current profile with the measuring of the buffer current.

5. The method of claim 4, wherein matching the chirp injection current profile with the measuring of the buffer current comprises performing a binary search to match the chirp injection current profile with a profile derived from the measuring of the buffer current.

6. The method of claim 1, wherein a first shape of the calibration ramp is opposite to a second shape of a frequency ramp of the frequency chirp.

7. The method of claim 1, further comprising:
adjusting a second set of capacitors of the capacitor bank of the PLL to a first capacitance value during a first portion of the acquisition phase; and
adjusting the second set of capacitors to a second capacitance value during a reset portion,
wherein calibrating the injection current of the chirp injection current profile is at least in part based on a current of the second set of capacitors.

8. The method of claim 7, wherein the generating the frequency chirp comprises:
providing a first injection current value to the PLL during the first portion corresponding to the acquisition phase;
providing a second injection current value to the PLL during a second portion corresponding to a dwell phase; and
providing a third injection current value to the PLL during a third portion corresponding to the reset portion.

9. The method of claim 8, wherein the first portion includes a fourth portion corresponding to a settle phase of the acquisition phase.

10. The method of claim 1, wherein the PLL is configured to generate a radar pulse for a frequency-modulated continuous-wave (FMCW) radar system.

11. A frequency chirp signal generator configured to provide a frequency-modulated continuous-wave (FMCW) signal, the frequency chirp signal generator comprising:
a chirp timing engine configured to calibrate an injection current supplied to a first set of capacitors of a capacitor bank of a phase-locked loop (PLL) during a calibration phase of the PLL, wherein the capacitor bank is coupled to a buffer configured to output a buffer current that is used to calibrate the injection current; and
an injection digital to analog converter (DAC) configured to generate the calibrated injection current during a chirp sequence.

12. The frequency chirp signal generator of claim 11, wherein the chirp timing engine is further configured to:
feed a second set of capacitors with the buffer current from a calibration chirp; and
match the injection current with the buffer current.

13. The frequency chirp signal generator of claim 12, wherein matching the injection current comprises performing a binary search to match the injection current with the buffer current.

14. The frequency chirp signal generator of claim 12, wherein the injection DAC is configured to switch between the first set of capacitors during the chirp sequence and the second set of capacitors during a calibration chirp.

15. The frequency chirp signal generator of claim 11, wherein the chirp timing engine is further configured to:
adjust a first capacitance value of the first set of capacitors to a first value during an acquisition phase of the chirp sequence; and
adjust a second capacitance value of the first set of capacitors to a second value during a reset phase of the chirp sequence,
wherein calibrating the injection current is at least in part based on a current from the first set of capacitors.

16. The frequency chirp signal generator of claim 15, wherein the chirp timing engine is further configured to:
provide a first injection current value to the PLL during the acquisition phase of the chirp sequence;
provide a second injection current value to the PLL during the reset phase of the chirp sequence; and
provide a third injection current value to the PLL during a dwell phase of the chirp sequence.

17. A phase-lock loop (PLL) circuit configured to generate a frequency chirp for a frequency-modulated continuous-wave (FMCW) signal generator, comprising:
a chirp timing engine configured to generate a chirp injection current profile supplied to a first set of capacitors of a capacitor bank of a phase-locked loop (PLL) during a calibration phase of the PLL, wherein the capacitor bank is coupled to a buffer configured to output a buffer current that is used to generate the chirp injection current profile; and
an injection digital to analog converter (DAC) configured to generate a calibrated injection current supplied to the first set of capacitors based on the chirp injection current profile at the PLL during a chirp sequence.

18. The PLL circuit of claim 17, wherein the chirp timing engine is configured to perform:
feeding a second set of capacitors with the buffer current during the calibration phase; and
matching the chirp injection current profile with the buffer current.

19. The PLL circuit of claim 18, wherein the buffer current is obtained from the buffer copying a voltage controlled oscillator signal generating a calibration ramp for a frequency chirp of the calibration phase.

20. The PLL circuit of claim 17, wherein the injection DAC is configured to perform:
providing a first injection current value according to the chirp injection current profile to the PLL during an acquisition phase of the chirp sequence;
providing a second injection current value according to the chirp injection current profile to the PLL during a reset phase of the chirp sequence; and
providing a third injection current value according to the chirp injection current profile to the PLL during a dwell phase of the chirp sequence.

* * * * *